United States Patent [19]

Chung

[11] Patent Number: 5,792,707
[45] Date of Patent: *Aug. 11, 1998

[54] GLOBAL PLANARIZATION METHOD FOR INTER LEVEL DIELECTRIC LAYERS OF INTEGRATED CIRCUITS

[75] Inventor: Henry Chung, Singapore, Singapore

[73] Assignee: Chartered Semiconductor Manufacturing Ltd., Singapore, Singapore

[*] Notice: This patent issued on a continued prosecution application filed under 37 CFR 1.53(d), and is subject to the twenty year patent term provisions of 35 U.S.C. 154(a)(2).

[21] Appl. No.: 789,721

[22] Filed: Jan. 27, 1997

[51] Int. Cl.$^6$ ........................................... H01L 21/316
[52] U.S. Cl. ................................. 438/633; 438/699
[58] Field of Search ........................ 437/195, 228, 437/228 PL, 238; 156/636.1, 662.1; 438/622, 624, 699, 692, 763, 633

[56] References Cited

U.S. PATENT DOCUMENTS

| | | | |
|---|---|---|---|
| 3,976,524 | 8/1976 | Feng | 156/8 |
| 4,525,448 | 6/1985 | Ghosh | 430/314 |
| 4,662,064 | 5/1987 | Hsu et al. | 29/591 |
| 4,954,459 | 9/1990 | Avanzino et al. | 437/228 |
| 5,015,602 | 5/1991 | Van Der Plas et al. | 437/67 |
| 5,290,396 | 3/1994 | Schoenborn et al. | 156/636.1 |
| 5,298,110 | 3/1994 | Schoenborn et al. | 156/636.1 |
| 5,350,486 | 9/1994 | Huang | 156/633 |
| 5,356,513 | 10/1994 | Burke et al. | 156/636.1 |
| 5,362,669 | 11/1994 | Boyd et al. | 437/67 |
| 5,441,094 | 8/1995 | Pasch | 156/636.1 |
| 5,491,113 | 2/1996 | Murota | 437/228 |
| 5,663,108 | 9/1997 | Lin | 438/624 |
| 5,688,720 | 11/1997 | Hayashi . | |

FOREIGN PATENT DOCUMENTS

| | | | |
|---|---|---|---|
| 0545263 | 6/1993 | European Pat. Off. | 156/636.1 |

OTHER PUBLICATIONS

Wolf, Stanley *Silicon Processing for the VLSI Era* vol. 1, Lattice Press, pp. 407–409, 1986.

Wolf, Stanley Silicon Processing for the VLSI Era, vol. 2, Lattice Press, pp. 181–212, 1990.

*Primary Examiner*—Chandra Chaudhari
*Assistant Examiner*—Matthew Whipple
*Attorney, Agent, or Firm*—George O. Saile; Stephen B. Ackerman; William J. Stoffel

[57] ABSTRACT

The present invention provides a method of manufacturing of planarizing an insulating layer using a sized reversed interconnect mask and two polish stop layers. Spaced interconnections 14 are provided over the semiconductor substrate 10. An insulating layer 22 is formed over the interconnections 14 forming valleys 18 between the spaced interconnections 14. A first polish stop layer 26 is formed over the insulating layer 22. A dielectric layer 30 is formed over the first polish stop layer 26. A second polish stop layer 36 is formed over the dielectric layer 30. The top of the second polish stop layer 36 over the valley 23 is coplanar with the top of the first polish stop layer 26 over the interconnect 14. A reduced size, reverse interconnect mask 40 is formed over the second polish stop layer 36. The reduced size, reverse interconnect mask 40 covers portions of the valleys 23 between the spaced interconnections 14. The second polish stop layer 36 is etched using the reverse interconnect mask 40 as an etch mask leaving second polish stop blocks 36A over the narrow valleys 23. The dielectric layer 30 over the interconnections 14 is chemical-mechanical polished using the first polish stop layer 26 and second polish stop layer blocks 36A as a polish stop thereby providing the dielectric layer 30 with a planar top surface. The second polish blocks 36A eliminate the "dishing" problem associated with chemical-mechanical polishing processes.

17 Claims, 3 Drawing Sheets

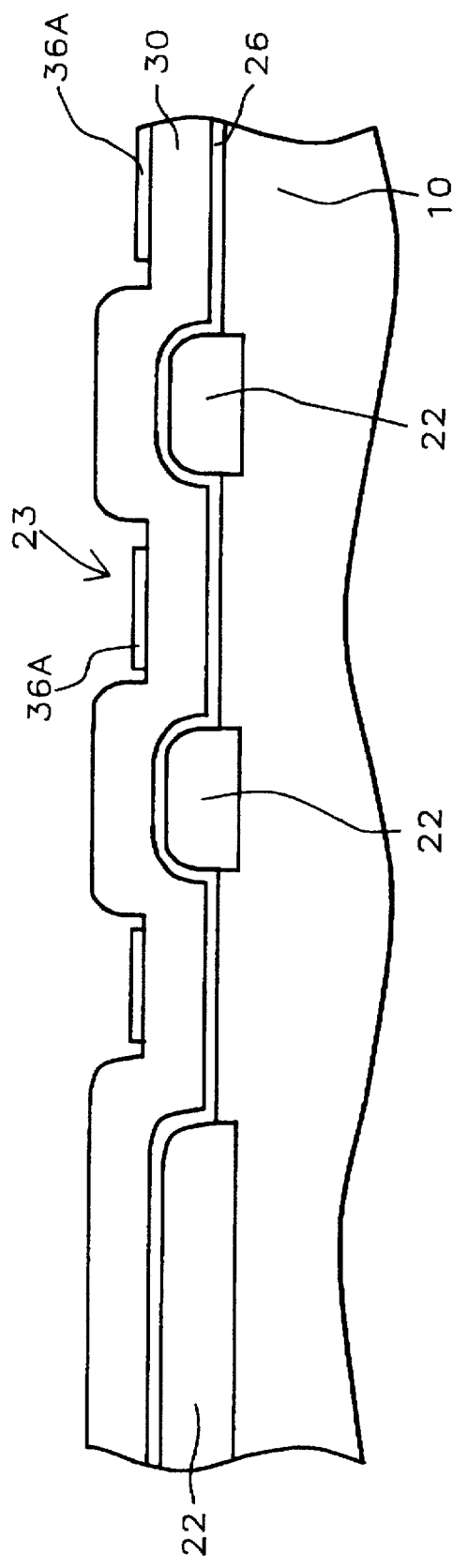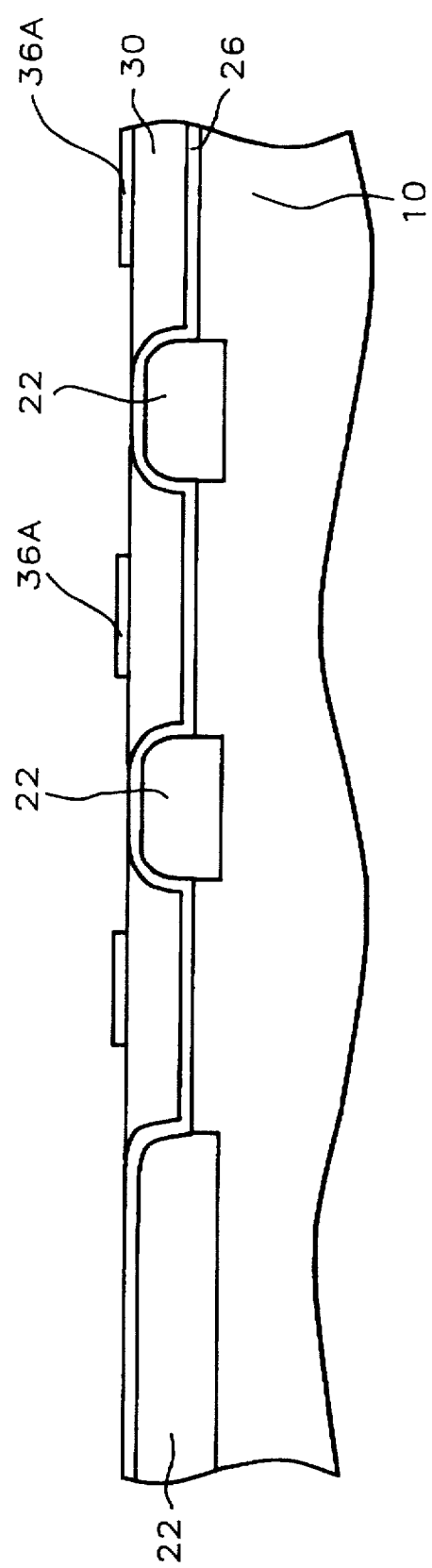

GLOBAL PLANARIZATION METHOD FOR INTER LEVEL DIELECTRIC LAYERS OF INTEGRATED CIRCUITS

BACKGROUND OF INVENTION

1) Field of the Invention

This invention relates generally to the planarizing of integrated circuit structures and more particularly to an improved process for global planarization of a dielectric layer using (CMP) two polish stop layers and a reversed reduce sized mask.

2) Description of the Prior Art

A major challenge in semiconductor manufacturing is the planarization of insulating layers formed over depressions and raised portions over a semiconductor structure (e.g., a wafer or the layers over a wafer). The depression in the surface of the semiconductor structure can be a space located between conductive lines (for example of aluminum or of polycrystalline) disposed on a substrate, but may also be a groove etched into the substrate or it may be a window provided in an insulating layer.

A typical structure would be formed in the following manner. A patterned conductive layer is formed over a semiconductor structure (or a trench formed in a wafer) creating an irregular surface. An insulating layer would be formed over the irregular surface. The insulating layer would be planarized to create a level surface upon which additional layers of metal or other devices are formed.

There are numerous known methods for planarizing wafer during fabrication of integrated circuits, for example, block resist and resist etch back, block resist and spin on glass. A promising and simple method of choice is chemical-mechanical polish (CMP). Chemical-mechanical polishing (CMP) provides full wafer planarization without additional masking or coating steps. However, one of the difficulties encountered with CMP for hollow/valley/trench planarization is the "dishing" effect which occurs in wide low spots (e.g., valleys between interconnects or metal lines or trenches) (i.e., usually >25 µm wide). Dishing is the removal portions of insulating layer below the top plane of the insulating layer over level or higher areas. Dishing is particularly sever in hollows (e.g., areas without a high area upon which the polishing pad contacts) wider than 100 µm. The "dishing" effect during polishing results in thinning of the dielectric layer in wide trenches resulting in a non-planar surface. The polish rate is affected by the topology of the surrounding areas.

Much effort has been directed to modify the polish process, equipment and materials attempt to reduce and control the dishing effect. For example, U.S. Pat. No. 5,362,669 (Boyd et al.) shows a method of planarization using a polish stop layer over a depression. The invention selectively removes the polish stop layer over the high regions. U.S. Pat. No. 5,350,486 (Huang) shows a method of forming a polish stop layer and an insulating layer over raised portions. The insulating layer is chemical-mechanical polished down to the polish stop. U.S. Pat. No. 5,015,602 (Van Der Plas et al.) shows a method of forming reverse image photoresist over low spots on an insulating surface. The insulating layer is etched and then planarized using CMP. U.S. Pat. No. 4,954,459 (Avanzino et al.) shows a method of reverse image photoresist and etch over depressions. Then planarization by CMP. However, these methods can be further improved upon by providing a simpler, more manufacturable process which yields a more planar surface.

SUMMARY OF THE INVENTION

It is an object of the present invention to provide a method for planarizing a dielectric layer over raised portions using two polish stop layers which provide superior planarization.

It is an object of the present invention to provide a method for planarizing a dielectric layer over interconnections using two polish stop layers and a reduced size reverse interconnect mask which prevents "dishing" effects.

It is an object of the present invention to provide a method for planarizing a dielectric layer over field oxide regions and trenches using two polish stop layers and a reduced size reverse (image) interconnect mask which prevents "dishing" effects.

To accomplish the above objectives, the invention provides a method of chemical-mechanical polishing an insulating layer using a reduced size reverse interconnect photoresist mask and two polish stop layers. The method begins by forming spaced raised portions 14 22 separated by valleys 23 over a semiconductor substrate 10. A first polish stop layer 26 is formed over the spaced raised portions 22. A dielectric layer 30 is formed over the first polish stop layer 26. A second polish stop layer 36 is formed over the dielectric layer 30. A reduced size, reverse interconnect photoresist mask 40 is formed over the second polish stop layer 36. The reduced size, reverse interconnect mask 40 covers portions of the narrow valleys 23 between the spaced raised portions 22. The second polish stop layer 36 is etched using the reverse interconnect mask 40 as an etch mask leaving second polish stop blocks 36A over the narrow valleys 23. The dielectric layer 30 over the interconnections 14 is chemical-mechanical polished using the first polish stop layer 26 and second polish layer blocks 36A as a polish stop thereby providing a planar surface of the dielectric layer 30.

The present inventions provides a cost effective method and eliminates the dishing problem typically experienced with chemical-mechanical polishing processes. The two polish stop layers 26 36A prevent dishing effects in valley areas 23. The reduced size, reverse interconnect mask is effective in patterning the second polish stop layer 36A while being cost effective.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 through 5 are cross sectional views for illustrating a method planarizing a dielectric layer using a reduced size, interconnect mask according to the present invention.

DETAILED DESCRIPTION OF THE PREFERRED EMBODIMENTS

Figure 1:
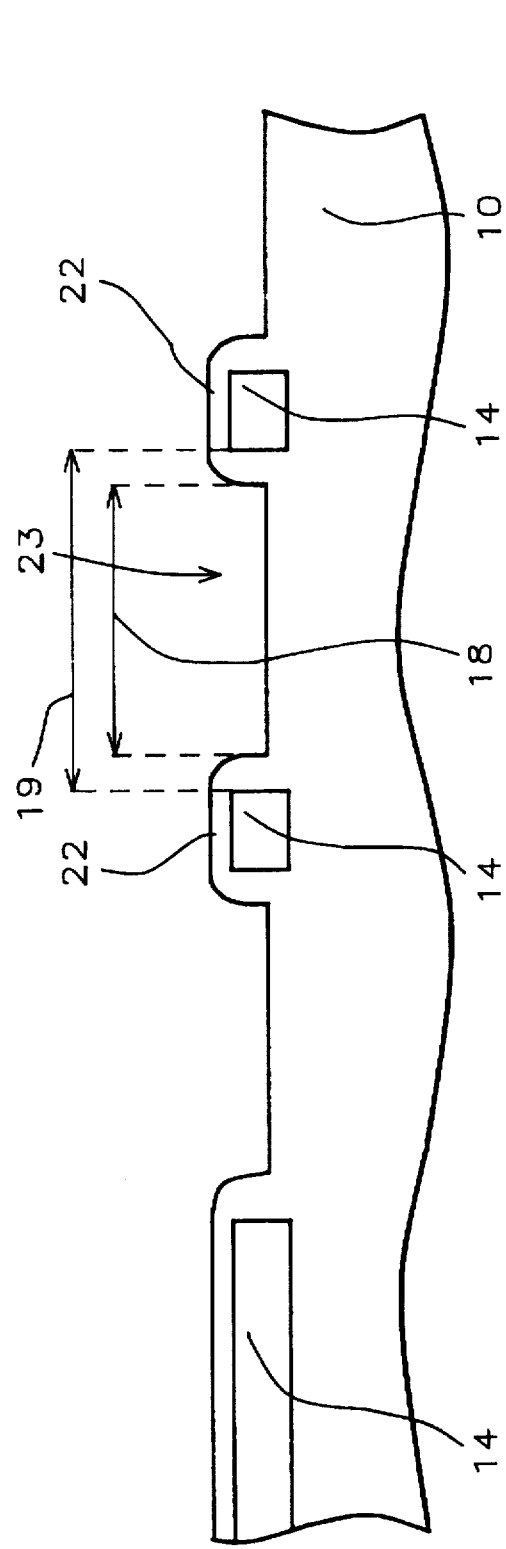

The present invention will be described in detail with reference to the accompanying drawings. The invention provides an improved method for forming highly planarized topologies in integrated circuit structures wherein oxide is used between active or conductive regions formed in or on an integrated circuit structure. In the illustrated embodiment, the process of the invention is shown, by way of illustration and not of limitation, as applied to in forming a highly planarized structure with a raised pattern such as, by not limited to, metal lines (interconnects or conductive patterns) formed over an integrated circuit structure previously formed in and on a substrate, with oxide up and or between the raised pattern. The invention can also be applied to the forming of a highly planarized integrated circuit structure having field oxide regions deposited between active regions in a silicon substrate. For example, raised portions 22 in figure can represent the substrate and/or field oxide and the low area (e.g., valley 23) can represent a trench in the substrate.

The invention provides a method of chemical-mechanical polishing an insulating layer using a reduced size reverse interconnect mask 40 and two polish stop layers 26 36. See FIG. 3. The method begins by providing semiconductor device structures in and on a semiconductor substrate 10. Substrate is understood to possibly include a semiconductor wafer, active and passive devices formed within the wafer and layers formed on the wafer surface. The term "substrate" is mean to include devices formed within a semiconductor wafer and the layers overlying the wafer.

As shown in FIG. 1, raised portions 14 22 are provided over the semiconductor substrate 10. The raised portions 14 22 can represent conductive material patterned to form conductive (e.g., metal) lines represented by both 14 22. Also, raised portions 14 22 can represent spaced interconnections (e.g., conductive lines )14 with an insulating layer 22 thereover). Between the raised portions are valleys 23 (e.g., hollows or valley topography between the raised portions). When the raised portions 14 22 comprise a conductor, the raised portions may comprise any conductor used in forming integrated circuit structures, such as, for example, aluminum, cooper, polysilicon or tungsten, capable of withstanding the temperature subsequently used in deposition the conformal and planarizing layers thereon. The raised pattern 14 22 might also comprise a combination of a raised pattern 14 of conductor and an insulating layer 22 formed over the conductor (as shown in FIG. 1), or it might only comprise an insulating material or only conductive material (see e.g., FIG. 2) and combinations thereof.

As shown in FIG. 1, the raised portions 22 14 preferably comprise a conductor (interconnect) 14 covered by an insulating layer 22. The spaced interconnections 14 preferably have a height in a range of between about 3000 and 10,000 Å and preferably a width in a range of between about 1 and 300 µm and preferably a first spacing 19 between the interconnections 14 in a range of between about 1 and 300 µm.

An insulating layer 22 is formed over the interconnections 14 forming valleys 23 between the insulating layer over the spaced interconnections 14. The insulating layer 22 is preferably composed of silicon oxide, B or P doped oxide, or other low dielectric constant dielectric materials. The insulating layer 22 preferably has a thickness in a range of between about 1000 and 20,000 Å. The valleys 23 have a width 18 in a range of between about 1 and 300 µm and a depth 25 in a range of between about 4000 and 30,000 Å.

Figure 2:
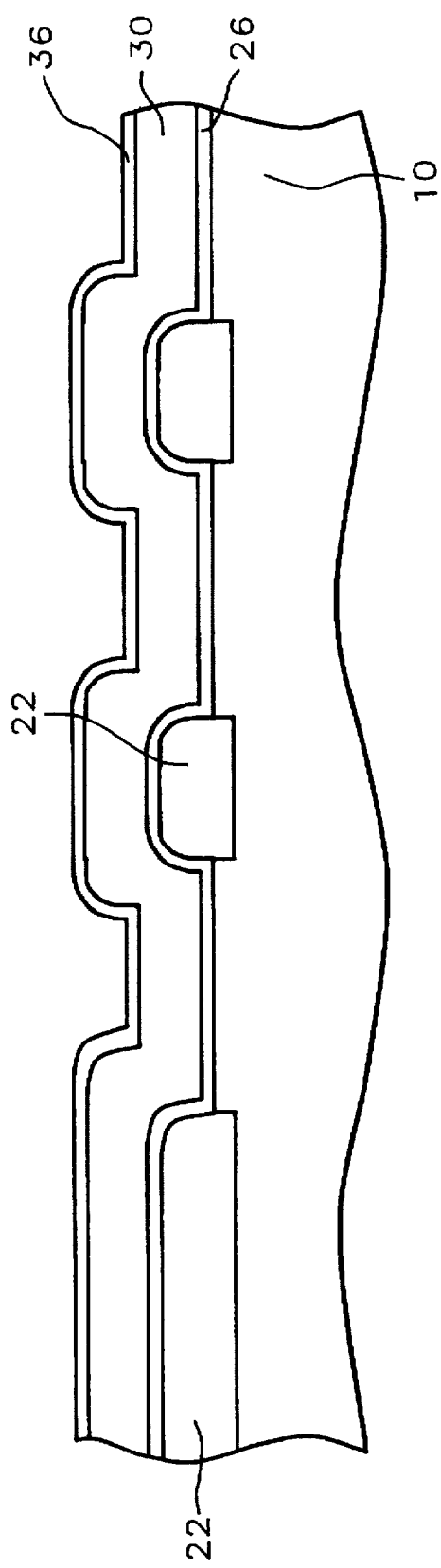

As shown in FIG. 2, a first polish stop layer 26 is formed over the raised portion (e.g., insulating layer) 22. The first polish stop layer 26 is composed of a chemical mechanical polish resistant material. The first polish stop layer 26 is preferably composed of silicon nitride, or other dielectric materials, and is more preferably formed of a low dielectric constant material. The first polish stop layer 26 preferably has a thickness in a range of between about 50 and 2,000 Å.

A dielectric layer 30 is formed over the first polish stop layer 26. The thickness of the dielectric layer is about sufficient to fill the valleys 23 level with the top of the raised portions 22. The dielectric layer 30 preferably composed of silicon oxide or TEOS, and more preferably composed of a silicon oxide. The dielectric layer preferably has thickness in a range of between about 10,000 and 30,000 Å.

Still referring to FIG. 2, a second polish stop layer 36 is formed over the dielectric layer 30. The second polish stop layer 36 located in the valleys is coplanar with the top of the first polish stop layer 26 over the raised portion 22. The top surface of the second polish stop layer 36 over the valley 23 is within about +/ 5000 Å and more preferably about +/– 1000 Å of the plane of the top surface of the first polish stop layer 26 over the raised portion 22. The combined thicknesses of the first polish stop layer, the dielectric layer, and the second polish stop layer are sufficient to fill the center of the valley 23 coplanar with the surface 26A of the first polish layer 26 over the raised portions 22. The second polish stop layer 36 is preferably composed of silicon nitride, or can be a metallic material. The second polish step 36 does not have to be composed of the same material as the first polish stop layer 26. The second polish layer 36 preferably has a thickness in a range of between about 100 and 2000 Å.

Figure 3:
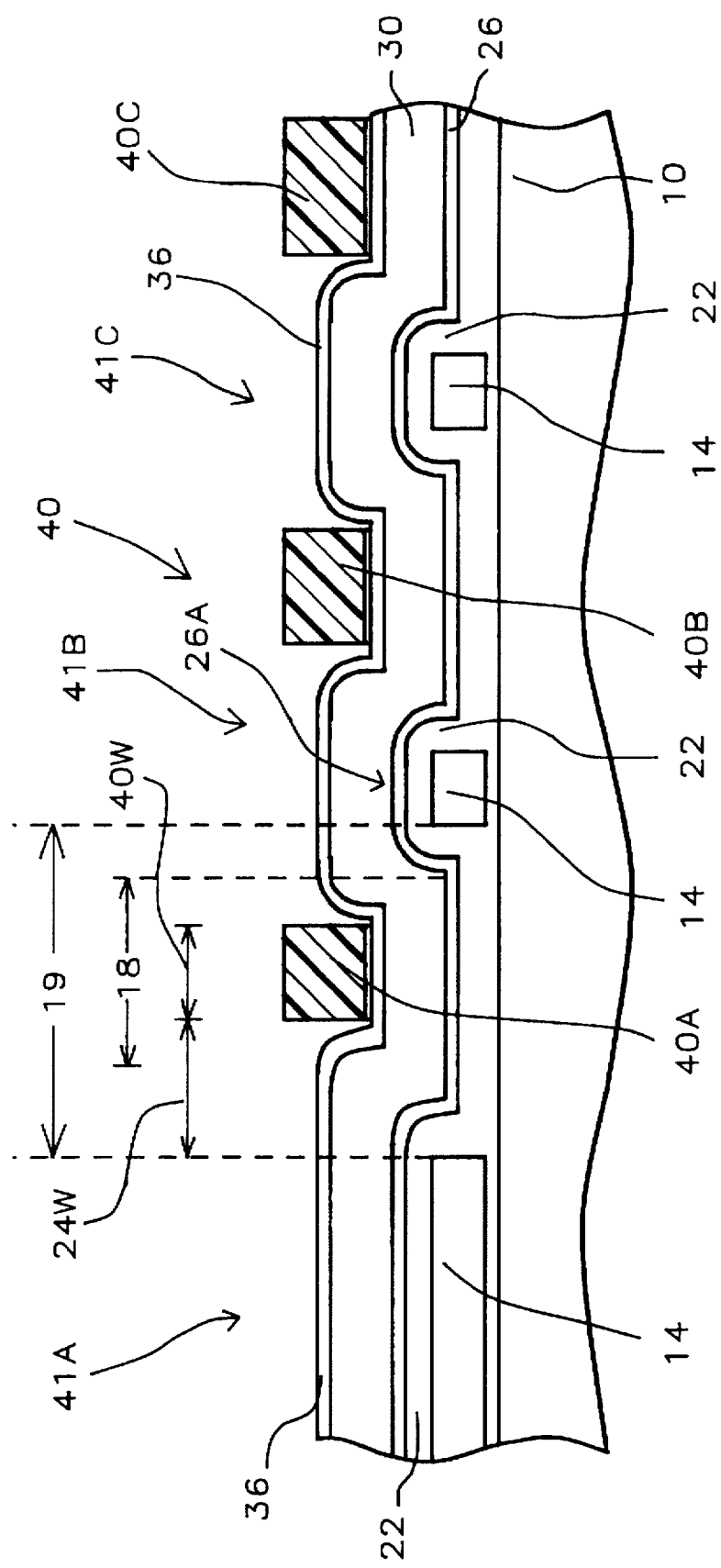

As shown in FIG. 3, a reduced size reverse interconnect photoresist mask 40 (reduced size reverse "raised portion" photoresist mask 40) is formed over the second polish stop layer 36. The reduced size reverse interconnect photoresist mask 40 is the "reverse" image of the mask used to form the interconnects 14 or 14 22 or raised portion 14 22 (e.g., field oxide, trench, etc.). The reduced size reverse interconnect photoresist mask 40 is between about 0 and 5% smaller in area than the "full size" reverse interconnect mask and more preferably between about 1 and 4% smaller in area (e.g., length and width dimensions). The reverse interconnect mask 40 (40A 40B 40C) covers portions of the valleys 23 between the spaced interconnections 14 (raised portions 22).

A photolithographic mask (e.g., optical mask), not shown which may be a reverse or negative mask of the mask used in the formation of the interconnects 14 (or raised portions) is used to exposed regions 41A 41B 41C that overlie the interconnects 14 (or raised portions 22). The reduced size reverse photolithographic mask has a metal pattern that is smaller in area than a full sized reverse mask.

Alternatively, a negative photoresist layer may be used in place of the layer 40 and exposed through the optical mask used in the formation of the interconnects 14 to form the patterned photo resist 40 as shown. The negative photoresist is under exposed to create the reduced size photoresist pattern 40 shown in FIG. 3. The photoresist is under exposed between about 5 to 20%. Another option is the interconnect mask can be increased in size.

The sized reverse interconnect mask 40 covers portions of the valleys 23 between the spaced raised portions 22. The sized reverse interconnect mask 40 is in registry with the valleys 23 between the interconnects. The sized reverse interconnect mask 40 has openings 41A 41B 41C in registry with the raised portions 22.

The sized reverse interconnect mask 40 has photoresist blocks 40A, 40B 40C that have a width in a range of between about 1 µm and 300 µm. These blocks 40A 40B 40C are smaller (e.g., 0 to 5% smaller) than the area between the raised portions 22.

FIG. 3 shows several measurements. The distance between adjacent interconnects 14 is distance 19. The combined thickness of the insulating layer 22, the first polish stop layer 26, the dielectric layer 30 and the second polish stop layer 36 is represented by length 24W. This length 24W is the amount that reversed interconnect mask blocks 40A, 40B, 40C, are reduced in size (or "sized") compared to a full sized reversed mask.

The reversed interconnect mask has a width 40W within about +/−5% of the width 19 minus the two times the width 24W. (See FIG. 3).

$W_{40W} = W_{19} - (2*(W_{24W}))$

Similarly, the relationship holds for the length of the mask. Also, $W_{40W}$ must be equal to or greater than the lithographic resolution. If $W_{40W}$ is not, it should be set to zero, i.e., no mask is made for this region. Also, a similar measurement technique can be used to fit the mask 40 to field oxide regions and trenches, etc., depending on the particular mask used to define the devices 22.

As shown in FIG. 4, the second polish stop layer 36 is etched using the reverse interconnect mask 40 as an etch mask leaving second polish stop blocks 36A over the valleys 23.

The second polish stop layer 36 is preferably etched using the photoresist mask 40 as an etch mask. The etch can be a plasma or wet etch and isotropic or anisotropic. The polish stop should etch as fast as or much faster than the dielectric layer 30. The photoresist layer 40 can be removed by any etch including an $O_2$ asher process.

As shown in FIG. 5, the dielectric layer 30 over the interconnections 14 is then chemical-mechanical polished using the first polish stop layer 26 and second polish layer blocks 36A as a polish stop thereby providing a planar surface of the dielectric layer 30.

As shown in FIG. 5, the wafer is subjected to a chemical mechanical polishing technique which is conducted to at least the point of stopping at the upper surfaces of polish stop layers 36A and 26. An example slurry would be the SCI slurry, available from Rodel Products Corporation of Newark, Del. U.S.A. Such slurry comprises KOH, or $NH_4OH$, $SiO_2$ particles and water. A typical CMP polish time would be from about 1 to 2 minutes. Any residual slurry left on the wafer surface would be removed by a conventional wet cleaning technique.

The fully exposed second polish stop 36A, if preferred, can be selectively removed.

The present inventions provides a cost effective method and eliminates the dishing problem. The two polish stop layers 26 36A prevent dishing effects in valley 23 areas. The reduced size, reverse interconnect mask is effectual in patterning the second polish stop layer while being cost effective.

It should be will understood by one skilled in the art that by including additional process step not described in this embodiment, other types of devices can also be included over the substrate. It should also be understood that the figures depict only several raised portions (e.g., interconnects) out of a multitude of raised portions that are fabricated simultaneously on the substrate.

The planarizing layer 30 of the invention can be formed over conductive lines, trench in substrate, field oxide regions, etc. as is obvious to those skilled in the art. The raised portions 14 22 in the figures could represent, for example, the silicon substrate or field oxide and the valleys could be the trenches or low spot of the substrate.

While the invention has been particularly shown and described with reference to the preferred embodiments thereof, it will be understood by those skilled in the art that various changes in form and details may be made without departing from the spirit and scope of the invention.

What is claimed is:

1. A method of chemical-mechanical polishing a dielectric layer comprising the steps of:
    a) providing a semiconductor substrate having spaced raised portions and valleys therebetween, wherein said raise portions are defined by a photolithographic process including exposing a first photoresist layer using a first optical mask;
    b) forming a first polish stop layer over said raised portions;
    c) forming a dielectric layer over said first polish stop layer;
    d) forming a second polish stop layer over said dielectric layer;
    e) forming a reduced size, reverse raised portion mask over said second polish stop layer; said reduced size reverse raised portion mask covering portions of said valleys between said raised portions, said reduced size reverse raised portion mask is in registry with said valleys, and said reduced size reverse raised portion mask has openings in registry with said raised portions; said reduced size reverse raised portion mask is a reduced size reverse image of said spaced raised portions; said reduced size reverse raise portion mask is defined by exposing a photoresist layer with said first optical mask;
    f) etching said second polish stop layer using said reduced size reverse raised portion mask as an etch mask leaving second polish stop blocks over said valleys;
    g) removing said reduced size reverse raised portion mask; and
    h) planarizing said dielectric layer over said raised portions using said first polish stop layer and second polish layer blocks as a polish stop thereby providing a planar surface of said dielectric layer.

2. The method of claim 1 wherein said reduced size mask has an area between about 1 to 4% smaller compared a full sized reverse mask.

3. The method of claim 1 wherein the top of said second polish stop layer located over said valley is about coplanar with the top of the first polish stop layer located over said raised portions.

4. The method of claim 1 wherein said second polish stop layer, over said valley, has a height within a distance of the plane of the top surface of said first polish stop layer over said raised portion in a range of between about +/− 1000 Å.

5. The method of claim 1 wherein the combined thicknesses of said first polish stop layer, said dielectric layer, and said second polish stop layer being about sufficient to fill the center of said valley coplanar with the surface of said first polish layer over said raised portions.

6. The method of claim 1 wherein said raised portions are interconnect layers covered by an insulating layer.

7. The method of claim 1 wherein said raised portions are segments of said substrate and said valley are a trenches in said substrate.

8. The method of claim 1 wherein said raised portions are segments of field oxide and said valleys are portions of said substrate.

9. The method of claim 1 wherein the planarizing of said dielectric layer is performed by chemical-mechanical polishing said dielectric layer to remove all parts of said dielectric layer that extends above the surface of said first polish stop over said raised portions and the coplanar surface of said second polish stop blocks over said valley, whereby said second polish stop blocks prevent dishing of said dielectric layer.

10. A method of chemical-mechanical polishing a dielectric layer comprising the steps of:
    a) providing semiconductor device structures in and on a semiconductor substrate;
    b) providing spaced interconnections over said semiconductor substrate; said spaced interconnections are defined by exposing a first photoresist layer using a first optical mask;
    c) forming an insulating layer over said interconnections forming valleys between said spaced interconnections;
    d) forming a first polish stop layer composed of silicon nitride over said insulating layer;
    e) forming a dielectric layer over said first polish stop layer;

f) forming a second polish stop layer composed of silicon nitride over said dielectric layer, the combined thicknesses of said first polish stop layer, said dielectric layer and said second polish stop layer being about sufficient to fill the center of said valley coplanar with the surface of said first polish layer over said interconnects.

g) forming a reduced size reverse interconnect mask over said second polish stop layer; said reduced size reverse interconnect mask is defined by photolithographic process including exposing a photoresist layer with said first optical mask; said reduce size reverse interconnect mask covering portions of said valleys between said spaced interconnection; said reduced size reverse interconnect mask is in registry with the valleys between said interconnects and said reduced size reverse interconnect mask has openings in registry with said interconnections; said reduced size reverse interconnect is reduced in area between about 1 to 4% compared to a full size reverse mask; said reduce size reverse interconnect mask has a reduce size reverse image of said spaced interconnections; etching said second polish stop layer using said reduced size reverse interconnect mask as an etch mask leaving second polish stop blocks over said valleys; and i) planarizing the resulting structure by a step of chemical-mechanical polishing said dielectric layer to remove all parts of said dielectric layer that extends above the surface of said first polish stop over said interconnections and the coplanar surface of said second polish blocks layer over the center of said valley, whereby said second polish stops blocks prevent dishing of said dielectric layer.

11. The method of claim 10 wherein said spaced interconnections have a height in a range of between about 3000 and 10,000 Å and a width in a range of between about 1 and 300 μm and a first spacing between said interconnections in a range of between about 1 and 300 μM.

12. The method of claim 10 wherein said insulating layer is composed of silicon oxide and has a thickness in a range of between about 1000 and 20,000 Å and said valleys having a width in a range of between about 1 and 300 μm and a depth below the top of said insulating layer over said interconnections in a range of between about 4000 and 30,000 Å.

13. The method of claim 10 wherein said dielectric layer is composed of oxide and said dielectric layer having thickness in a range of between about 10,000 and 20,000 Å.

14. The method of claim 10 wherein said second polish stop layer over said valley has a height within a distance of the plane of the top surface of said first polish stop layer over said raised portion in a range of between about +/− 1000 Å.

15. The method of claim 10 wherein step (g) further includes: said reduce size reverse interconnect mask has a width ($W_{40W}$) between +5% and −5% of that given by the following equation:

$$W_{40W} = W_{19} - (2*(W_{24W}))$$

where $W_{40W}$ is the width of said reduce size reverse interconnect mask, $W_{19}$ is the width of a full sized reverse interconnect mask, and $W_{24W}$ is the sum of the thicknesses of said insulating layer, said first polish stop layer, and said dielectric layer.

16. A method of chemical-mechanical polishing a dielectric layer comprising the steps of:

a) providing semiconductor device structures in and on a semiconductor substrate;

b) providing spaced interconnections over said semiconductor substrate; said spaced interconnections defined using a first optical mask;

c) forming an insulating layer over said interconnections forming valleys between said spaced interconnections; said spaced interconnections have a height in a range of between about 3000 and 10,000 Å and a width in a range of between about 1 and 300 μm and a first spacing between said interconnections in a range of between about 1 and 300 μM;

d) forming a first polish stop layer composed of silicon nitride over said insulating layer;

e) forming a dielectric layer over said first polish stop layer; said dielectric layer is composed of silicon oxide and said dielectric layer having thickness in a range of between about 10,000 and 30,000 Å;

f) forming a second polish stop layer composed of silicon nitride over said dielectric layer, the combined thicknesses of said first polish stop layer, said dielectric layer and said second polish stop layer being about sufficient to fill the center of said valley coplanar with the surface of said first polish layer over said interconnects; said second polish stop layer is composed of silicon nitride and said second polish layer having a thickness in a range of between about 100 and 2000 Å;

g) forming a reduced size reverse interconnect mask over said second polish stop layer; said reduced size reverse interconnect mask covering portions of said valleys between said spaced interconnections; said reduced size reverse interconnect mask is in registry with said valleys between said interconnects, and said reduced size reverse interconnect mask has openings in registry with the interconnections; said reduced size reverse interconnect mask is reduced in area between about 1 to 4% compared to a full size reverse mask; said reduced size reverse interconnect mask is a reduced size reverse image of said spaced interconnects said reduced size reverse interconnect mask is defined by a photolithographic process including exposing a photoresist layer with said first optical mask;

h) etching said second polish stop layer using said reduced size reverse interconnect mask as an etch mask leaving second polish stop blocks over said valleys;

i) planarizing the resulting structure by a step of chemical-mechanical polishing said dielectric layer to remove all parts of said dielectric layer that extends above the surface of said first polish stop over said interconnects and the coplanar surface of said second polish blocks layer over the center of said valley, whereby said second polish stops blocks prevent dishing of said dielectric layer.

17. The method of claim 16 wherein step (g) further includes: further includes: said reduce size reverse interconnect mask has a width ($W_{40W}$) between +5% and −5% of that given by the following equation:

$$W_{40W} = W_{19} - (2*(W_{24W}))$$

where: $W_{40W}$ is the width of said reduce size reverse interconnect mask, $W_{19}$ is the width of a full sized reverse interconnect mask, and $W_{24W}$ is the sum of the thicknesses of said insulating layer, said first polish stop layer, and said dielectric layer.

* * * * *